US011354460B2

(12) United States Patent
Zuccarelli et al.

(10) Patent No.: US 11,354,460 B2
(45) Date of Patent: Jun. 7, 2022

(54) VALIDATOR AND OPTIMIZER FOR QUANTUM COMPUTING SIMULATOR

(71) Applicant: Red Hat, Inc., Raleigh, NC (US)

(72) Inventors: Luigi Zuccarelli, Waterford City (IE); Leigh Griffin, Waterford City (IE)

(73) Assignee: RED HAT, INC., Raleigh, NC (US)

( * ) Notice: Subject to any disclaimer, the term of this patent is extended or adjusted under 35 U.S.C. 154(b) by 794 days.

(21) Appl. No.: 16/162,049

(22) Filed: Oct. 16, 2018

(65) Prior Publication Data

US 2020/0117764 A1 Apr. 16, 2020

(51) Int. Cl.
*G06F 30/20* (2020.01)
*G06N 10/00* (2022.01)

(52) U.S. Cl.
CPC ............ *G06F 30/20* (2020.01); *G06N 10/00* (2019.01)

(58) Field of Classification Search
CPC ...... G06F 30/20; G06F 2117/12; G06F 30/00; G06N 10/00
USPC ...................................................... 703/21, 13
See application file for complete search history.

(56) References Cited

U.S. PATENT DOCUMENTS

| | | | | |
|---|---|---|---|---|
| 8,832,165 B2 * | 9/2014 | Allen | G06N 10/00 | 708/200 |
| 2007/0239366 A1 * | 10/2007 | Hilton | B82Y 10/00 | 702/27 |
| 2009/0031308 A1 * | 1/2009 | Busche | G06F 9/542 | 718/101 |
| 2017/0351967 A1 * | 12/2017 | Babbush | G06N 10/00 | |
| 2019/0042677 A1 * | 2/2019 | Matsuura | G06F 30/20 | |
| 2019/0220782 A1 * | 7/2019 | Chen | G06N 5/003 | |

FOREIGN PATENT DOCUMENTS

CN 107683460 A 2/2018

OTHER PUBLICATIONS

Klusch, Matthias et al., "Programming and Simulation of Quantum Search Agents", 2007, IEEE. (Year: 2007).*

Lanzagorta, Marco et al., "Hybrid Quantum-Classical Computing with Applications to Computer Graphics", Jul. 31, 2005, ACM Siggraph, ACM. (Year: 2005).*

A C++ Quantum Circuit Simulator with Realistic Noise Oct. 16, 2018.

(Continued)

*Primary Examiner* — Cedric Johnson
(74) *Attorney, Agent, or Firm* — Haynes and Boone, LLP

(57) ABSTRACT

The disclosed techniques relate to validating and optimizing a quantum computing simulator. A quantum computing simulator executes a quantum executable file to obtain a first result. A second result is received from a quantum computer which also computes the quantum executable file. The hardware metadata associated with the quantum computer, and defining hardware conditions during a time in which the quantum executable file was executed to create the second result, is also received. In response to determining a difference between the first result and the second result, updated hardware metadata is created based on the received hardware metadata associated with the quantum computer. The quantum computing simulator performs a second execution of the quantum executable file based at least in part on the updated hardware metadata to obtain a third result.

20 Claims, 4 Drawing Sheets

(56) References Cited

OTHER PUBLICATIONS

Classical Drivers and Machines Dec. 10, 2017.
Simulation of Grover's Algorithm Quantum Search in a Classical Computer Dec. 9, 2010.
Programming and Simulation of Quantum Search Agents Nov. 2007.

* cited by examiner

VALIDATOR AND OPTIMIZER FOR QUANTUM COMPUTING SIMULATOR

FIELD OF DISCLOSURE

The present disclosure generally relates to computer systems, in particular to validating and optimizing a quantum computing simulator.

BACKGROUND

Quantum computers perform computations utilizing quantum-mechanical phenomena, such as superposition and entanglement. Unlike classical computers that process data encoded in binary bits, each of which is always in one of two definite states ("0" or "1"), quantum computers process data in units of quantum bits (qubits) that can be in superpositions of states. "Superposition" refers to the ability of each qubit to represent both a "1" and a "0" at the same time. The qubits in a superposition can be correlated with each other (referred to as "entanglement"). That is, the state of a given qubit (whether it is a "1" or a "0") can depend on the state of another qubit. A quantum computer with N qubits can be in a superposition of up to $2^N$ states simultaneously. Compared to the classical computers that can only be in one of these $2^N$ states at a particular time, quantum computers have higher compute power and may solve difficult problems that are intractable using the classical computers.

SUMMARY

A system of one or more computers can perform particular operations or actions by virtue of having software, firmware hardware, or a combination thereof installed on the system that in operation causes or cause the system to perform the actions. One or more computer programs can perform particular operations or actions by virtue of including instructions that, when executed by data processing apparatus, cause the apparatus to perform the actions. One general aspect includes a method including: performing a first execution of a quantum executable file on a quantum computing simulator to obtain a first result; receiving a second result of the quantum executable file computed by a quantum computer; receiving hardware metadata associated with the quantum computer, the hardware metadata defining hardware conditions during a time in which the quantum executable file was executed to create the second result; in response to determining a difference between the first result and the second result, creating updated hardware metadata associated with the quantum computing simulator, the updated hardware metadata based on the received hardware metadata associated with the quantum computer; performing a second execution of the quantum executable file on the quantum computing simulator to obtain a third result, wherein the second execution is based at least in part on the updated hardware metadata.

One general aspect includes a computing system including: a non-transitory memory storing a code coverage module; one or more hardware processors coupled to the non-transitory memory and that execute instructions to cause the system to perform operations comprising: performing a first execution of a quantum executable file on a quantum computing simulator to obtain a first result; receiving a second result of the quantum executable file computed by a quantum computer; receiving hardware metadata associated with the quantum computer, the hardware metadata defining hardware conditions during a time in which the quantum executable file was executed to create the second result; in response to determining a difference between the first result and the second result, creating updated hardware metadata associated with the quantum computing simulator, the updated hardware metadata based on the received hardware metadata associated with the quantum computer; performing a second execution of the quantum executable file on the quantum computing simulator to obtain a third result, wherein the second execution is based at least in part on the updated hardware metadata.

One general aspect includes a non-transitory machine-readable medium having stored thereon machine-readable instructions executable to cause a machine to perform operations including: performing a first execution of a quantum executable file on a quantum computing simulator to obtain a first result; receiving a second result of the quantum executable file computed by a quantum computer; receiving hardware metadata associated with the quantum computer, the hardware metadata defining hardware conditions during a time in which the quantum executable file was executed to create the second result; in response to determining a difference between the first result and the second result, creating updated hardware metadata associated with the quantum computing simulator, the updated hardware metadata based on the received hardware metadata associated with the quantum computer; performing a second execution of the quantum executable file on the quantum computing simulator to obtain a third result, wherein the second execution is based at least in part on the updated hardware metadata.

DETAILED DESCRIPTION

Figure 1:
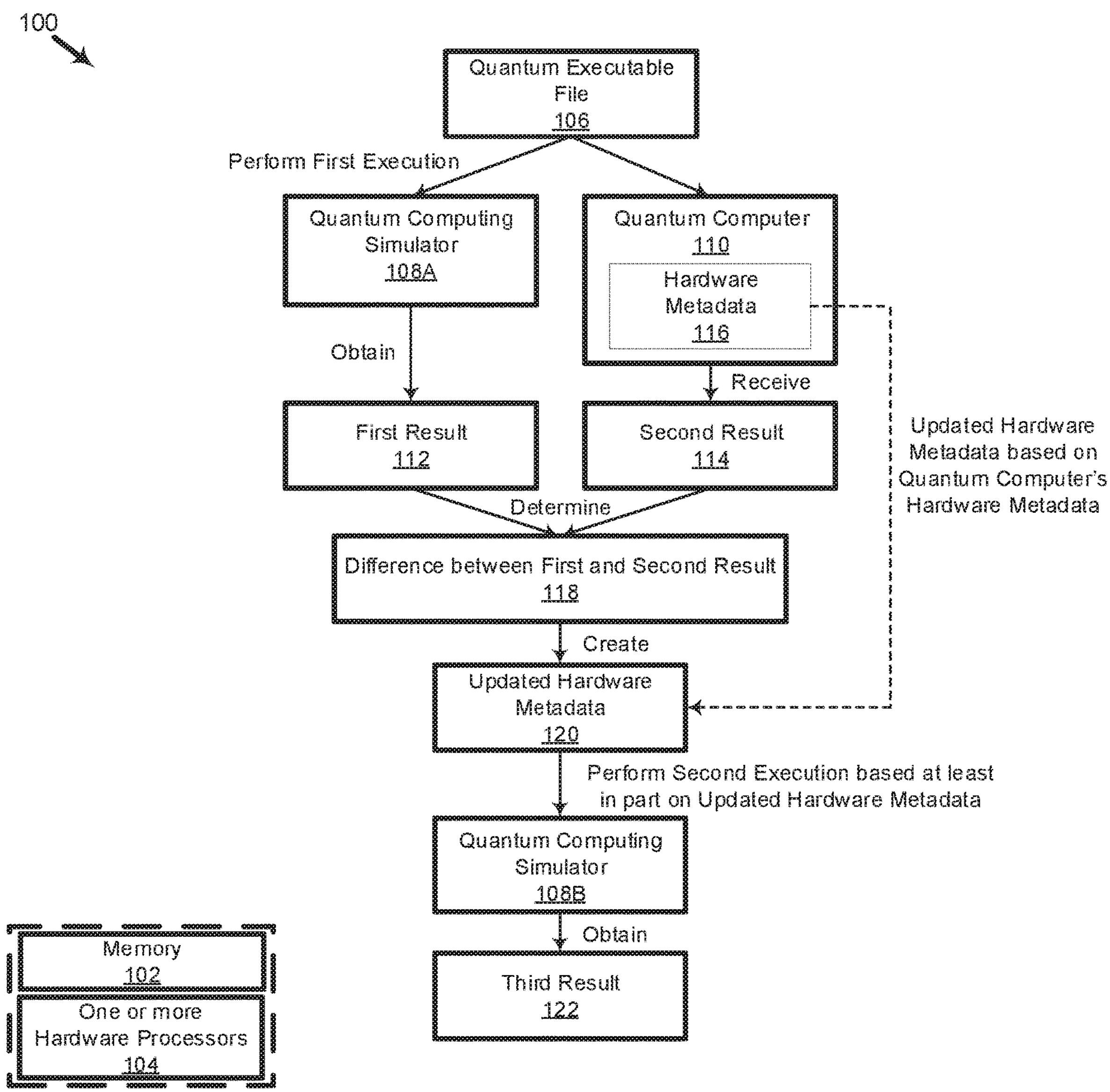
FIG. 1 is an organizational diagram illustrating a system 100 to route a request to a node using a consistent hash function taking a session identifier and topology information as inputs, in accordance with various examples of the present disclosure.

This disclosure relates to computer systems, and more particularly to validating and optimizing a quantum computing simulator. Methods, systems, and instructions stored on computer-readable media for performing such validation and optimization are disclosed.

At present, quantum computers are more expensive to build and to run than classical computers. To make quantum computing accessible to the large majority of users who do not have the means to build or own a quantum computer, large organizations and research institutes have begun to make their quantum computers available over the cloud. In addition, quantum simulators or emulators have also been introduced to help users learn about quantum computing. Essentially, quantum simulators are classical computers that attempt to mimic the functioning of a quantum computer. They may be used, for example, to teach students about the basics of quantum computing. Because quantum simulators run on classical computer hardware, users may safely experiment with different input algorithms in a quantum-like environment without consuming valuable quantum computing resources.

Yet, to date, little to no work has been performed to explain and validate the simulator's results against the actual quantum computer's results. The onus has been on a simulator developer or an end user to interpret any differences in the results, since traditionally, no explanation is given even if the results were to differ significantly. Thus, developers and users are often left to wonder whether the differences between the simulated and actual results were caused by an erroneous input file, an erroneous simulator, an erroneous quantum hardware, or some combination of the three. Because the input file is user-configurable, users often assume that inconsistent results are caused by the user's erroneous programming of the input file. While generally true, some users have instead discovered after hours of tweaking their input files to no avail, that it is the quantum simulator, and not the input file, that has been incorrect programmed.

Such enervating situations may be avoided by a validator service which validates the simulator's result and provides recommendations to the user or the developer to make appropriate changes to the input file or the simulator code to resolve or narrow the differences between the simulator's results and the quantum computer's results. Using such a validation service, a user may be saved from wasting time modifying and troubleshooting an otherwise error-free input file, and a developer may be saved from wasting time modifying and troubleshooting an otherwise error-free simulator.

For example, the validation service may look into the possibility that the difference in the results was caused by an erroneous input file. The validation service may test the quantum computing software using a control input file which had previously produced a simulator result that was consistent with the quantum computer's result. If upon retesting, the same input file produces significantly different simulator results as previous, but similar quantum computer results as previous, then the validator service may conclude that both the input file and the quantum computer are not at issue, but the simulator is. Conversely, if the input file produces similar results in the simulator, but different results in the quantum computer, then the validator service may conclude that both the input file and the quantum computing simulator are not at issue, but that the quantum computer is. Or, the validator service may conclude that the operating conditions of the quantum computer have changed, and the changed conditions have not been accounted for in the quantum computing simulator.

Thus, the validation service may consider multiple possibilities, and guide the developer in his or her troubleshooting efforts of the quantum simulator. For example, the validation service may recommend corrective actions to the developer based on whether the discrepancies in the simulated and actual results were caused by factors "extrinsic" to the quantum simulator, such as the quantum simulator's failure to apply "hardware metadata"—operating conditions and operating errors representative of the actual conditions of the quantum computing hardware—or if the discrepancies were a result of "intrinsic" factors, such as the simulator's incorrect treatment of gate manipulations. The failure of a quantum computing simulator to account for "extrinsic" factors may occur, for example, when a quantum simulator ignores a quantum computer's operating conditions when processing the QASM file, or when the quantum computing simulator takes the operating conditions into account but assumes conditions that are not actually representative of the operating conditions of the quantum computing hardware.

Often, simulators incorrectly assume optimum hardware metadata, or that the hardware metadata is unchanged from a previous simulation. However, in reality, quantum computers are extremely sensitive to real-world fluctuations in temperature, vibration, electromagnetic fields, etc., and even minute changes to these may affect a quantum computer's results. Thus, simulators should have the same sensitivity to hardware metadata, otherwise, the likelihood that a simulator's results would differ significantly from the quantum computer's may be substantial. As such, if a validator service determines that the hardware metadata have not been properly taken into account, a simulator developer may be guided to include the hardware metadata or adjust the corresponding algorithms in the simulator's code to better account for the hardware metadata. For example, the developer may be guided to apply different types or magnitudes of errors such as gate errors, readout errors, multiqubit errors, or other types of metadata that may affect a quantum computer's results.

Yet, if the differences are caused by "intrinsic" factors, such as incorrect gate manipulations in the simulator's code, then including or adjusting hardware metadata may not lead to effective reconciliation of the differences in the results. In such cases, the recommended action may not be as simple as changing an error rate or a coherence value, but may require more extensive changes to the simulator's code. This is because incorrect gate manipulations or mis-emulations may arise, for example, from a developer's misunderstanding of the validity of certain quantum gate manipulations or permissible sequences of such gate manipulations. Thus, the validation service may recommend changing, for example, how certain combinations of gate manipulations are performed by the simulator by identifying relevant portions of the simulator's code corresponding to the erroneous gate manipulations.

Thus, it would be advantageous for a developer to know whether the differences in the results are caused by issues that are "extrinsic" or "intrinsic" to the quantum computing simulator, as such knowledge would allow the developer to determine what sorts of changes, if any, need to be made to the simulator's code. Additionally, informing the users that the simulator, and not the input file, is at fault would increase the users' confidence in the accuracy of the quantum computer's results, even if those results were to differ significantly from the simulator's. Moreover, users would not waste time, money, and effort unnecessarily tweaking and re-running their input files through costly quantum hardware to verify or reconcile simulator results, if the users are informed by the validator service that the simulator is erroneous. The disclosed techniques thus aid users and developers in interpreting differences in quantum simulator and quantum computer results, while providing actionable insights and helpful recommendations to developers to rectify the "extrinsic" or "intrinsic" portions of the simulator's code.

FIG. 1 is an organizational diagram illustrating a system 100 for validating a quantum computing simulator result and updating hardware metadata of the quantum computing simulator, in accordance with various examples of the present disclosure.

The system 100 includes memory 102 and one or more hardware processors 104. The memory 102 may be a non-transitory memory. The memory 102 may be structured to include at least one machine-readable storage medium on which is stored one or more set of instructions (e.g., software) including any one or more of the methodologies or functions described herein. The memory 102 may be structured to include one or more of a read-only memory (ROM), flash memory, dynamic random access memory (DRAM) such as synchronous DRAM (DFRAM), double data rate (DDR SDRAM), or DRAM (RDRAM), and so forth, static memory (e.g., flash memory, static random access memory (SRAM), and so forth), and a data storage device (e.g., a hard disk drive (HDD), solid state drive (SSD), and so forth). Accordingly, any of the operations, steps, and actions of the methods described herein may be implemented using corresponding machine-readable instructions stored on or in the memory 102 that are executable by the hardware processor 104.

In more detail regarding the hardware processor 104, the hardware processor 104 is structured to include one or more general-purpose processing devices such as a microprocessor, central processing unit (CPU), and the like. More particularly, the hardware processor 104 may include a complex instruction set computing (CISC) microprocessor, reduced instruction set computing (RISC) microprocessor, very long instruction word (VLIW) microprocessor, or a processor implementing other instruction sets or processors implementing a combination of instruction sets. In some examples, the hardware processor 104 is structured to include one or more special-purpose processing devices such as an application specific integrated circuit (ASIC), a field programmable gate array (FPGA), a digital signal processor (DSP), network processor, and so forth. The hardware processor executes instructions for performing the operations, steps, and actions discussed herein.

The memory 102 is structured to store a first result 112 and a second result 114. The first result 112 may be obtained by executing a quantum executable file 106, such as an appropriately parsed quantum assembly language (QASM) input file, using a quantum computing simulator 108A. The second result 114 may be obtained by executing the quantum executable file 106 using a quantum computer 110, which may be located remotely from the system 100 but may still be accessible to the system 100 via a network such as the internet. The system 100 may include network interfaces, components, and protocols which the system 100 may use to communicate with the quantum computer 110 over the network. Additionally, the quantum computer 110 may include hardware metadata 116. Hardware metadata 116 may include operating parameters or other parameters indicative of the operating conditions of the quantum computer 110. For example, hardware metadata 116 may include a frequency, a coherence time, a gate error, a readout error, and a multiqubit error.

The quantum executable file 106 may include or encode a quantum algorithm such as a Turing complete algorithm. Such algorithms may be processed by a quantum computing simulator 108A or a quantum computer 110. The quantum executable file 106 may be stored on the system 100, or if not stored on the system 100, may be remotely accessible to the system 100 via a network. The system 100 may upload the quantum executable file 106 to the quantum computer 110, if, for example, the quantum executable file 106 is locally stored on the system 100 but the quantum computer 110 is remotely located from the system 100. The uploading may be via a user interface, such as a graphical user interface or a command line interface accessible via a website associated with the quantum computer 110.

The quantum executable file 106 may be processed by the quantum computer 110 using quantum hardware. For example, the quantum computer 110 may execute the Turing complete algorithm included in the quantum executable file 106 to produce second result 114. The second result 114 as generated by the quantum computer 110 may be in a .CSV (comma separated values) file format or any other file format. In some examples, the second result 114 is converted from its original format to another file format used by the quantum computing simulator 108A or a validator service. In some examples, the .CSV file format of the first result 112 is converted to a JavaScript Object Notation (JSON) file format.

The quantum executable file 106 may also be processed by a quantum computing simulator 108A. In some examples, prior to processing by the quantum computing simulator 108A, the system 100 may pass the quantum executable file 106 through an interpreter, such as a QASM interpreter. However, in some examples, interpretation may not be required. The interpreter may be virtualized in a first virtual environment, such as a container, and include a quantum development kit, an operating system image, and a runtime. An example of a quantum development kit is QISKit, available from International Business Machine Corp. (IBM) of Armonk, N.Y. In some examples, the operating system image includes a REDHAT FEDORA LINUX image, available from Red Hat, Inc. of Raleigh, N.C. In some examples, the runtime includes a PYTHON runtime, available from the Python Software Foundation at www.python.org. In some examples, the container is a DOCKER container, available from Docker, Inc. of San Francisco, Calif. Other types of quantum development kits, operating systems, runtimes, and containers or virtual operating environments may be used. The interpreter interprets the quantum executable file 106 (e.g., a QASM file) and outputs a file in a format that can be processed by the quantum computing simulator 108A. For example, the output file may be a JSON file. The output file is thus a representation of the quantum algorithm in a non-QASM format. In some examples, the output file includes the hardware metadata contained in the quantum executable file 106 and other metadata useful for further processing, e.g., qubit size, simulator target, etc.

If interpretation was performed, the output file from the interpreter is fed into quantum computing simulator 108A. If no interpretation was required, the quantum executable file 106 may be fed into the quantum computing simulator 108A. In some examples, the quantum computing simulator 108A is virtualized in a second virtual environment, such as a container. The second virtual environment may be the same as, or different from, the first virtual environment. However, in some examples, the quantum computing simulator 108A is not virtualized. The second virtual environment may include a quantum simulator such as a C++ quantum simulator, an operating system image, and all supporting libraries required to support the running of the simulator based on the operating system image. Generally, a quantum simulator allows real quantum hardware, such as quantum computer 110, to be simulated on classical computers. Thus, any type of quantum simulator, in addition to C++ quantum simulators, may be used. The quantum computing simulator 108A processes the interpreted quantum executable file (if interpretation was required) or the quantum executable file 106 (if interpretation was not required) to generate a quantum simulator output file. The quantum simulator output file includes first result 112, which may include a single result, for example, if the algorithm was executed once, or a set of results, for example, if the algorithm was executed more than once. If the first result 112 matches the second result 114, then the system 100 may indicate that the algorithm in the quantum executable file 106 is capable of being run on the quantum computer 110.

However, if the first result 112 does not match the second result 114, i.e., there is a difference 118 between the first result 112 and the second result 114, then the first result 112 and the second result 114 may be passed to a service or program, such as a validator service, to compare the first result 112 with the second result 114. The validator service may be virtualized in a third virtual environment, such as a container. The third virtual environment may be the same as, or different from, the first and/or the second virtual environments. The third virtual environment may include a quantum development kit, an operating system image, a runtime, and the validator service. Thus, the first result 112 and the second result 114 may be fed into the third virtual environment for comparison. The validator service may first create a list of the differences between the first result 112 and the second result 114. In some examples, the first result 112 and the second result 114 may be expressed as tuples of the observed quantum states and the counts of the observed states. Thus, the list of the differences may include one or more of such differing tuples.

Based on the comparison, the validator service may recommend changes to the gates corresponding to the differing tuples. For example, if a significant number of tuples differed only in the third qubit, then the validator service may recommend changes to the gates applied to the third qubit. The recommended gate changes may be made on the quantum executable file 106, and the updated quantum executable file may be reprocessed by the quantum simulator 108A to generate a third result 122. The third result 122 may include a results set containing one or more tuples. The validator service may compare the third result 122 with the second result 114, and determine that the third result 122 more closely matches with the second result 114. In some examples, the third result 122 is also more efficiently generated than the second result 114 because of the recommended gate changes. For example, the validator service may have analyzed the gate sequences in the executable file 106 and recommended more efficient gate sequences that perform the same function. In some examples, the recommended gate sequences use fewer gates in the sequence or less computationally-intensive gates to perform the same function.

In some examples, the validator service also compares the hardware metadata (if any) applied by the quantum computing simulator 108A against hardware metadata 116 of the quantum computer 110. In some examples, the hardware metadata 116 includes the operating conditions, error rates, coherence times, frequencies, etc., of the quantum computer 110 while it was processing the quantum executable file 106. If differences exist between the hardware metadata applied by the quantum computing simulator 108A and the hardware metadata 116 of the quantum computer 110, the validator service may create new or updated hardware metadata 120 based on the hardware metadata 116. The quantum computing simulator 108A may reprocess the quantum executable file 106 using the updated hardware metadata 120. For ease of reference, a quantum computing simulator applying "old" hardware metadata may be referred to as quantum computing simulator 108A, while a quantum computing simulator applying the updated hardware metadata 120 may be referred to as quantum computing simulator 108B.

Thus, in generating the third result 122, the quantum computing simulator 108B may apply the updated hardware metadata 120, such as a new or updated frequency, a new or updated coherence time, a new or updated gate error, a new or updated readout error, a new or updated multiqubit error, etc. In some examples, the third result 122 more closely matches with the second result 114 as a result of the updated hardware metadata 120. In some examples, the third result 122 is computed more efficiently than the first result 112. For instance, the third result 122 may be computed more efficiently than the first result 112 when computations using the updated hardware metadata 120 is less complex than using hardware metadata 116. In some examples, the computations may be less complex because the hardware metadata 120 may include less parameters, and therefore fewer calculations may be performed.

The first, second, and third virtual environments may form a virtual ecosystem and may be backed by a continuous integration and delivery (CI/CD) service powered by Jenkins. The virtual ecosystem may be run on local machines or on an online platform such as RED HAT OPENSHIFT, available from Red Hat of Raleigh, N.C. The integration of the first, second, and third virtual environments through the pipeline means that once the quantum executable file 106 is loaded into the first virtual environment for interpretation, an automated chain of events is begun in that the output from the first virtual environment is fed into the second virtual environment for simulation, and the output of the simulation is fed into the third virtual environment for comparison by the validator service. By using application programming interfaces of the quantum computer, even the loading of the quantum executable file 106 into the quantum computer 110 may be automated, for example, by a scheduler. The output directory for the second result 114 generated by the quantum computer 110 may be monitored, such that second result 114 may be fed into the third virtual environment on detection of the results in the directory. Therefore, system 100 is a novel, fully automated development and test environment which bridges Classical and Quantum computing with optimizations at the simulator level.

Figure 2:
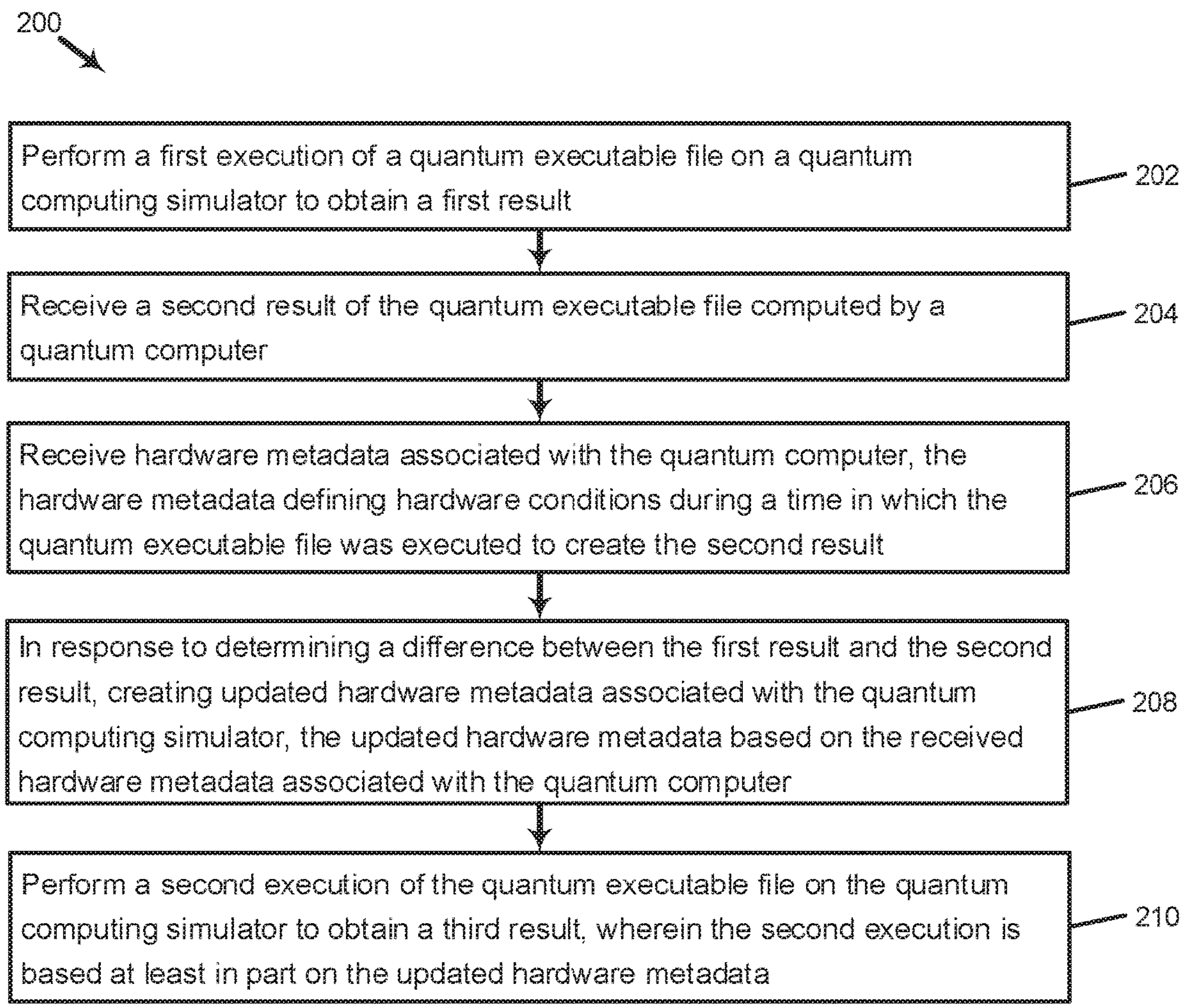
FIG. 2 is a flow diagram illustrating a method 200 system to route a request to a node using a consistent hash function taking a session identifier and topology information as inputs, in accordance with various examples of the present disclosure.

FIG. 2 is a flow diagram illustrating a method 200 to validate a quantum computing simulator result and to update hardware metadata of the quantum computing simulator, in accordance with various examples of the present disclosure. Method 200 may be performed by executing computer-readable instructions that are stored in memory 102 using one or more hardware processors 104 described with respect to FIG. 1. Additional actions may be provided before, during, and after the steps of method 200, and some of the actions described may be replaced, eliminated and/or re-ordered for other examples of the method 200. For example, method 200 may be performed in conjunction with systems 100, 300, and 400 described with respect to FIGS. 1, 3, and 4.

At action 202, a first execution of a quantum executable file is performed on a quantum computing simulator to obtain a first result. As described with respect to FIG. 1, the quantum computing simulator may be virtualized in an environment such as a container. The quantum computing simulator virtual environment may include a C++ quantum simulator, an operating system image, and all supporting libraries required to run the C++ quantum simulator. The quantum computing simulator container may output a JSON file which includes a results set. This results set may be referred to as the first result.

In some examples, the quantum executable file may include a Turing complete algorithm. In some examples, the quantum computing simulator may be a C++ quantum simulator. Thus, in some examples, a quantum executable file which includes a Turing complete algorithm may be fed into or processed by a C++ quantum simulator. However, in some examples, the quantum executable file which may be a QASM file, may not be immediately processable by the quantum simulator. Thus, in some examples, prior to processing the quantum executable file by the quantum computing simulator, the quantum executable file is interpreted using an interpreter described with respect to FIG. 1. The interpreted quantum executable file may then be fed into a quantum computing simulator, which may be written in or be compatible with other programming languages including: Collaborative Application Markup Language (CAML), Objective CAML (OCaml), F #, JAVA, JAVASCRIPT, JULIA, MAPLE, MATHEMATICA, MAXIMA, MATLAB, OCTAVE, .NET, PERL/PHP, PYTHON, RUST, Scheme, Haskell, LISP, and Meta Language (ML).

In some examples, a command line interface or a graphical user interface (GUI) is provided to the user to allow the user to interact with the quantum computing simulator. In some examples, the quantum computing simulator may be located remotely from the system 100 and interaction with the quantum computing simulator may be performed across a network. For example, an online-based or cloud-based quantum computing simulator may still be accessible to the system 100 via the internet. In some examples, the quantum computing simulator may be local or locally accessible to the system 100 over a bus or local network.

At action 204, a second result of the execution of the quantum executable file is obtained by processing the quantum executable file using a quantum computer. The quantum executable file that is executed by the quantum computer contains the same algorithm as the quantum executable file that was executed by the quantum computing simulator at action 202. In some examples, the quantum executable file that is executed by the quantum computer may differ in form but not function from the quantum executable file that was executed by the quantum computing simulator at action 202. For example, the quantum executable file may be formatted differently or be written in a different programming language for the quantum computing simulator as for the quantum computer. However, the quantum algorithm that is executed by the quantum computing simulator and the quantum computer are the same. Like the quantum computing simulator, the quantum computer may be locally- or remotely-located. Correspondingly, the second result may be received across local or network interfaces. One example of a quantum computer is the IBM Q quantum computer, a cloud-based quantum computer accessible via the internet at the IBM Q EXPERIENCE website. Quantum computers are also available from D-Wave Systems Inc. of Burnaby, British Columbia, Canada.

In some examples, the second result, i.e., the result generated by the quantum computer, may be included in file formats suitable for storage in databases or other data structures. For example, the second result may be included in a .CSV file output by the quantum computer after executing the quantum executable file. Thus, the second result may be delimited by commas or other suitable characters, and may be expressed or capable of being expressed in rows and columns. In some examples, the second result is converted from one file format to another (e.g., .CSV to JSON). The conversion may be performed using suitable converters, such as a .CSV to JSON converter.

At action 206, the hardware metadata associated with the quantum computer is received. As earlier described, the hardware metadata may include parameters that impact the performance of the quantum computing hardware, such as frequencies, coherence times, error rates, etc. In some examples, the hardware metadata is received together with, or may be a part of, the second result. For example, the hardware metadata may be stored in the same file or data structure as the second result. In some examples, the hardware metadata may be stored in a different file or data structure as the second result. In some examples, the hardware metadata may be captured in one or more rows of a .CSV file, and the values corresponding to different parameters may be offset by commas. In some examples, the hardware metadata defines or includes the hardware conditions while the quantum computer was executing the quantum executable file to create the second result. In some examples, the average hardware conditions during the execution of the quantum executable file are taken as the hardware metadata of the quantum computer. In some examples, the most optimal hardware conditions during the execution of the quantum executable file are taken as the hardware metadata of the quantum computer. In some examples, the least optimal hardware conditions during the execution of the quantum executable file are taken as the hardware metadata of the quantum computer.

At action 208, updated hardware metadata is created. In some examples, the updated hardware metadata is created in response to a determination of a difference between the first result and the second result. In some examples, the updated hardware metadata is created in response to a determination of a difference between the hardware metadata used by the quantum computing simulator and the hardware metadata used by the quantum computer. In some examples, the hardware metadata used by the quantum computing simulator is updated based on the received hardware metadata associated with the quantum computer, such as the received hardware metadata of action 206. For example, it may be determined that the coherence time used in the quantum computing simulator is different than the coherence time of the quantum computer when the quantum computer was executing the quantum executable file. Thus, updated hardware metadata may be created by replacing the quantum computing simulator's coherence time with the quantum computer's coherence time. In some examples, the updated hardware metadata may be created by introducing new parameters into the set of hardware metadata used by the quantum computing simulator to generate the first result. For example, if the quantum computing simulator did not take into account multiqubit errors in generating the first result, but multiqubit errors were in fact present when the quantum computer generated the second result, then updated metadata hardware with the multiqubit errors may be created.

In some examples, a validator service is used to compare the hardware metadata used by the quantum computing simulator (if any) with the received hardware metadata associated with the quantum computer. In some examples, the validator service is provisioned in a virtual environment, such as a container. The virtual environment may include a quantum development kit, an operating system image, a runtime, and the validator service. Thus, in some examples, the hardware metadata associated with the quantum computing simulator and the hardware metadata associated with the quantum computer may be compared in a virtual environment. Nevertheless, where the validator service is not virtualized the comparison may be performed in a non-virtualized environment.

Changes to the hardware metadata used by the quantum computing simulator may be recommended, for example by a validator service, based on the comparison of the hardware metadata. In some examples, the recommended changes to the hardware metadata require further authorization before the changes are implemented. Such authorization may be provided by a user. In some examples, the validator service may automatically update the quantum computing simulator's hardware metadata without awaiting user authorization. For example, if the simulator uses a separate hardware metadata file to load hardware metadata into the simulator for execution, then the validator service may automatically update the separate hardware metadata file. If the simulator parses hardware metadata from the quantum executable file, the validator service may update the hardware metadata in the quantum executable file.

In some examples, the validator service includes a version control system that is able to generate differences or "cliffs" between two files, such as a diff between a first result file and a second result file, or a diff between a first hardware metadata file and a second hardware metadata file. The validator service may create different versions of the updated hardware metadata file in the version control system, and use the version control system's change log functions to record the differences between the various versions. In some examples, the updated hardware metadata file may be a JSON file or other file format compatible for processing by the quantum computing simulator.

In some examples where the updated hardware metadata includes new or different parameters, the validator service may recommend changes to the quantum computing simulator's code to factor in the new parameters in its simulation. For example, if the old hardware metadata did not include multiqubit errors but the new hardware metadata does, the validator service may recommend factoring multiqubit errors into the quantum simulator's code. The validator service may also recommend relevant code, for example, from a community coding website or other website or database. In some examples, the validator service may access a data structure on such a community coding website, and retrieve the relevant code that would factor in the new or different parameters. Such code may be recommended for incorporation into the quantum computing simulator.

At action 210, the quantum executable file is again executed on the quantum computing simulator to obtain a third, re-executed result. In some examples, the re-executed quantum executable file includes updated hardware metadata, such as the updated hardware metadata from action 208. In some examples, because the updated hardware metadata is based on the actual hardware metadata of the quantum computer while the quantum computer was executing the quantum executable file, the re-executed result generated by the quantum computing simulator may be different from the earlier result. Additionally, in some examples, the re-executed result is closer to the quantum computer's result than the earlier result. In some examples, the re-executed result is computed more efficiently by the quantum computing simulator than the earlier result. In some examples, the re-executed result is both closer to the quantum computer's result and computed more efficiently than the earlier result.

Figure 3:
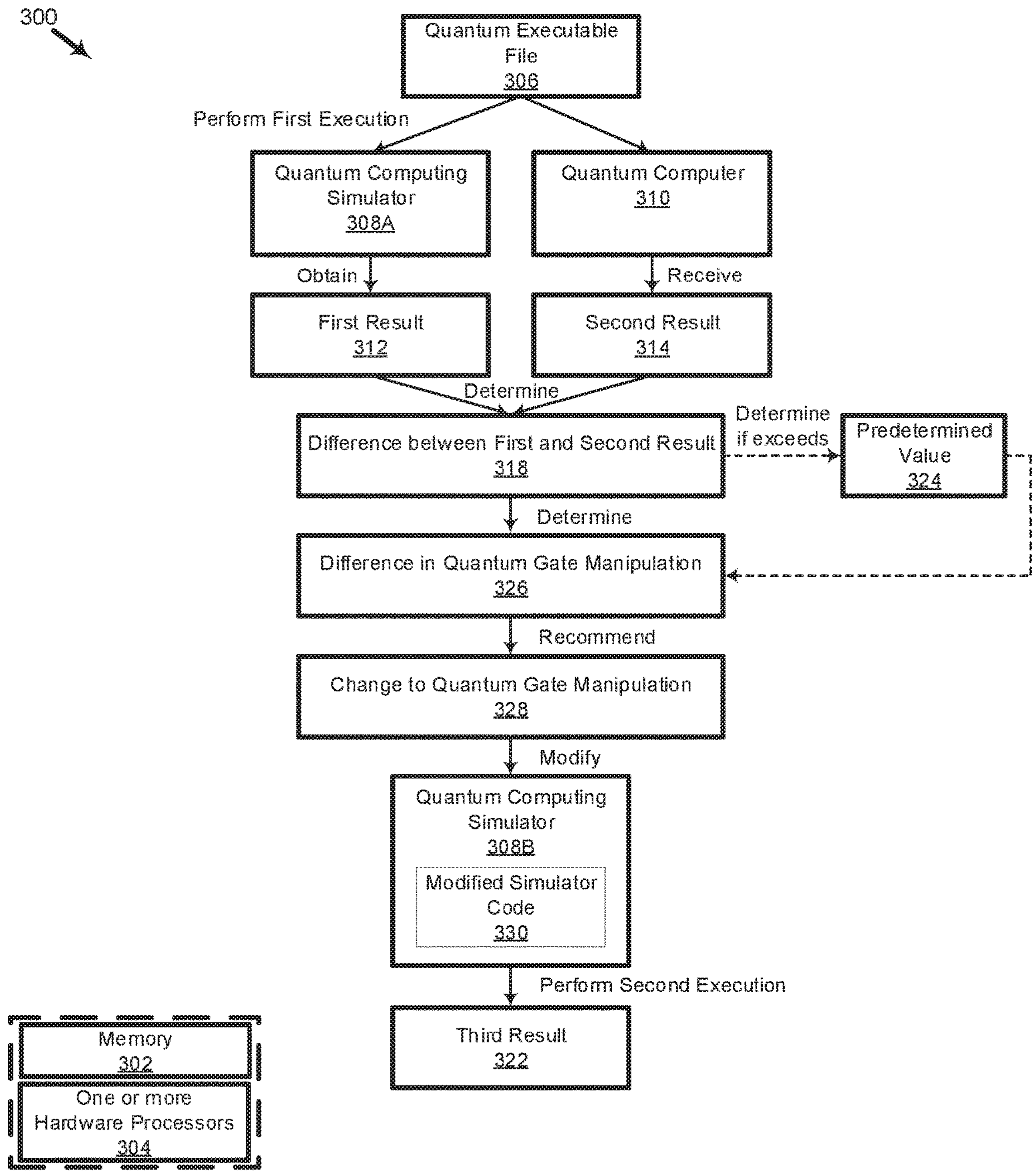
FIG. 3 is an organizational diagram illustrating a system 300 for validating a quantum computing simulator result and recommending changes to the quantum executable file and the quantum computing simulator.

FIG. 3 is an organizational diagram illustrating a system 300 for validating a quantum computing simulator result and recommending changes to a quantum executable file and the quantum computing simulator, in accordance with various examples of the present disclosure.

The system 300 includes memory 302 and one or more hardware processors 304 similar to memory 102 and one or more hardware processors 104 described with respect to FIG. 1. The memory 302 is structured to store a first result 312 and a second result 314. The first result 312 may be obtained by executing a quantum executable file 306 by a quantum computing simulator 308A. The second result 314 may be obtained by executing the quantum executable file 306 by a quantum computer 310. The second result 314 may be received from a quantum computer 310 after the quantum computer 310 executes the quantum executable file 306.

The first result 312 and the second result 314 may be converted to a format that is compatible with a validator service, such as the validator service earlier described with respect to FIGS. 1 and 2. In some examples, the validator service may be executed in a virtualized environment such as a container, and the virtual environment may include a quantum development kit, an operating system image, a runtime, and the validator service. The validator service may compare the first result 312 and the second result 314 to determine if any differences 318 exist between the first result 312 and the second result 314. In some examples, if the difference 318 between the first result 312 and the second result 314 exceeds a predetermined value 324, then the validator service may perform further analysis and recommend changes to the quantum executable file 306 or to the quantum computing simulator 308A or both.

However, because quantum computing is probabilistic, the second result 314 may not be the same every time that the quantum executable file 306 is processed by the quantum computer 310. To account for such inconsistencies, in some examples, the quantum executable file 306 may be executed by the quantum computer 310 multiple times, such as 1024 times. At each execution, the observed state of the qubits and the number of times that a particular combination of qubits is observed are recorded. Thus, in a 3 qubit quantum computer, there may be $2^3$ or 8 sets of possible observed states. These are (000), (001), (010), (011), (100), (101), (110), and (111). After 1024 executions of the algorithm, the results or the counts of the observed states may be as follows:

(000): 33;
(001): 29;
(010): 64;
(011): 501;
(100): 28;
(101): 161;
(110): 83; and
(111): 125.

Thus, (011), which was observed in 501 out of the 1024 executions, or approximately 48.9% of the time, is the most observed state and may represent the solution to the algorithm in the quantum executable file 306. Assume that the results shown above are the actual results of the quantum computer 310, i.e., second result 314. Assume also that when the same algorithm in the same quantum executable file 306 is put through the quantum computing simulator 308A, the (011) state was observed in only 50 out of the 1024 executions, or approximately 4.88% of the time.

If the probability of the (011) observed state is rather consistent, for example, after 128, 256, and 512 executions, (011) was observed 49.3%, 50.1%, 48.7%, and 49.6% of the time, then the (011) observed state is probably a correct solution, since the range of values for the (011) state is somewhat consistent and varies within an "acceptable" range. Compared to the quantum computer, in the quantum simulator the (011) state was observed in only 4.88% of the counts. Thus, the first result 312 deviates from the acceptable range of values of the second result 314 by a "large" amount, and such a large deviation may be more likely to be indicative of an error in the quantum computing simulator 308A or an error in the quantum executable file 306 than an error in the quantum computer 310. What an "acceptable" range of values for the second result 314 may be, and how "large" of a deviation is permissible, may all be predetermined by a user or by the system 300.

In some examples, a user specifies an "acceptable" range of values or deviation of some predetermined percentage, e.g., +1-10%, from an average value or median value. For example, the average probability of (011) occurring after 128, 256, and 512 executions, or the average of 49.3%, 50.1%, 48.7%, and 49.6% is 49.425% or 0.49425. In some examples, the system determines an "acceptable" range of values based on a predetermined confidence interval, such as a 95% confidence interval. For example, a 95% confidence interval for (011) occurring may be 49.0% to 49.8%. Thus, the predetermined value or values in the 95% confidence interval would be 49.0% to 49.8%. In some examples, a "large" deviation may be more than some predetermined percentage, e.g., +1-10% of a predetermined target value or a predetermined statistically significant value, e.g., the mode, mean, median, expected value, etc. In some examples, a "large" deviation may be more than some predetermined number of standard deviations away from a statistically significant value, e.g., the mode, mean, median, expected value, etc. Thus, in some examples, the predetermined value 324 may be based on empirical or statistical analysis, while in some examples, the predetermined value 324 may simply be an aspirational target or a benchmark value based on the type of quantum simulator, algorithm, quantum computer, etc.

Where the difference 318 exceeds the predetermined value 324, the validator service may compare the differing tuples in the first result 312 and the second result 314 and provide a best effort recommendation to make one or more quantum gate manipulation changes 328 in the quantum executable file 306. In making such a best effort recommendation, the validator service may compare one or more quantum executable files executing the same algorithm, e.g., Grover's algorithm, Shor's algorithm, etc., and determine which (if any) of the one or more executable files had generated results that were closer to the results generated by the quantum computer than the current quantum executable file 306. For example, out of 1024 executions of Grover's algorithm in the quantum executable file 306 by the quantum computer 310, (011) may have been observed 501 times in second result 314 of quantum computer 310, but only 100 times in a result R1 of executing a first quantum executable file Grover QASM 1 containing a first Grover's algorithm; 200 times in a result R2 of executing a second quantum executable file Grover QASM 2 containing a second Grover's algorithm; 300 times in a result R3 of executing a third quantum executable file Grover QASM 3 containing a third Grover's algorithm; 400 times in a result G4 of executing a fourth quantum executable file Grover QASM 4 containing a fourth Grover's algorithm; and 500 times in a result G5 of executing a fifth quantum executable file Grover QASM 5 containing a fifth Grover's algorithm.

The validator service may compare the algorithm in the current quantum executable file 306 with the algorithm in the quantum executable file having the closest results, i.e., Grover QASM 5. Specifically, the validator service may compare gate manipulation sequences performed on qubits where the differences in the results have manifested. The validator service may determine differences 326 in quantum gate manipulations between the algorithm of the current quantum executable file 306 and the algorithm of the quantum executable file having the closest results, i.e., Grover QASM 5. Based on the determination, the validator service may recommend updating the algorithms of the current quantum executable file 306 with the algorithms of the quantum executable file having the closest results, i.e., Grover QASM 5. In some examples, the validator service may, in addition to or in lieu of recommending algorithms to update, perform the updates automatically or without awaiting further authorization from a user or the system 300. In some examples, the quantum executable file 306 with the updated algorithms is re-run through the quantum computing simulator 308A and the quantum computer 310. In some examples, smaller or fewer differences exist between the results of the quantum computing simulator 308A and the quantum computer 310 because of the updated algorithms.

However, in some examples, the difference 318 may be mainly attributable to erroneous programming or other issues with the quantum computing simulator 308A. Thus, the validator service may recommend modifications to the simulator code instead of, or in addition to, quantum gate manipulation changes 328 to the quantum executable file 306. In some examples, based on the differing tuples, the validator service may flag or otherwise indicate that a portion of code which simulates a particular quantum operation is contributing to the differences 318. The validator service may recommend reviewing the portion of code at issue for optimization. In some examples, the validator service also recommends the code to be used.

For example, the validator service may compare one version of the code which has generated fewer or smaller differences 318 with the current version of the code used in the quantum computing simulator 308A. For example, out of 1024 executions of Grover's algorithm, (011) may have been observed 501 times in second result 314 of quantum computer 310, but only 100 times in Quantum Computing Simulator 408A v1; 200 times in Quantum Computing Simulator 408A v2; 300 times in Quantum Computing Simulator 408A v3; 400 times in Quantum Computing Simulator 408A v4; and 500 times in Quantum Computing Simulator v5. The validator service may thus compare the code of quantum computing simulator 308A with the code of Quantum Computing Simulator v5 (version 5). As a result of the comparison, the validator service may recommend replacing a portion of the current version of the code with a corresponding portion of the version of the code which has fewer or smaller differences 318 than the current version of the code, e.g., version 5.

In some examples, the validator service compares code between different but comparable simulators, such as simulators written in the same programming language and processing the same algorithm, and recommends changes to the code based on the code of the comparable simulator which is known to generate the fewest or smallest differences 318. For example, out of 1024 executions of Grover's algorithm, (011) may have been observed 501 times in second result 314 of quantum computer 310, but only 100 times in Simulator 1; 200 times in Simulator 2; 300 times in Simulator 3; 400 times in Simulator 4; and 500 times Simulator 5. The validator service may thus recommend changes to the code of quantum computing simulator 308A based on the code of Simulator 5.

In some examples, the simulator code recommendations may be accepted, for example, by a user or developer of the quantum computing simulator 308A. In some examples, the simulator code recommendations may be applied automatically by the system 300 to the quantum computing simulator 308A. For clarity, the quantum computing simulator 308A may be referred to as quantum computing simulator 308B when the changed or modified simulator code 330 has been applied. The quantum computing simulator 308B may then use the modified simulator code 330 to reprocess the quantum executable file 306 to generate a third result 322. In some examples, the third result 322 is closer to the second result 314, i.e., there are fewer or smaller differences between the third result 322 and the second result 314 than the differences 318 between the first result 312 and the second result 314. In some examples, the third result 322 is within the predetermined value 324 of the second result 314.

Figure 4:
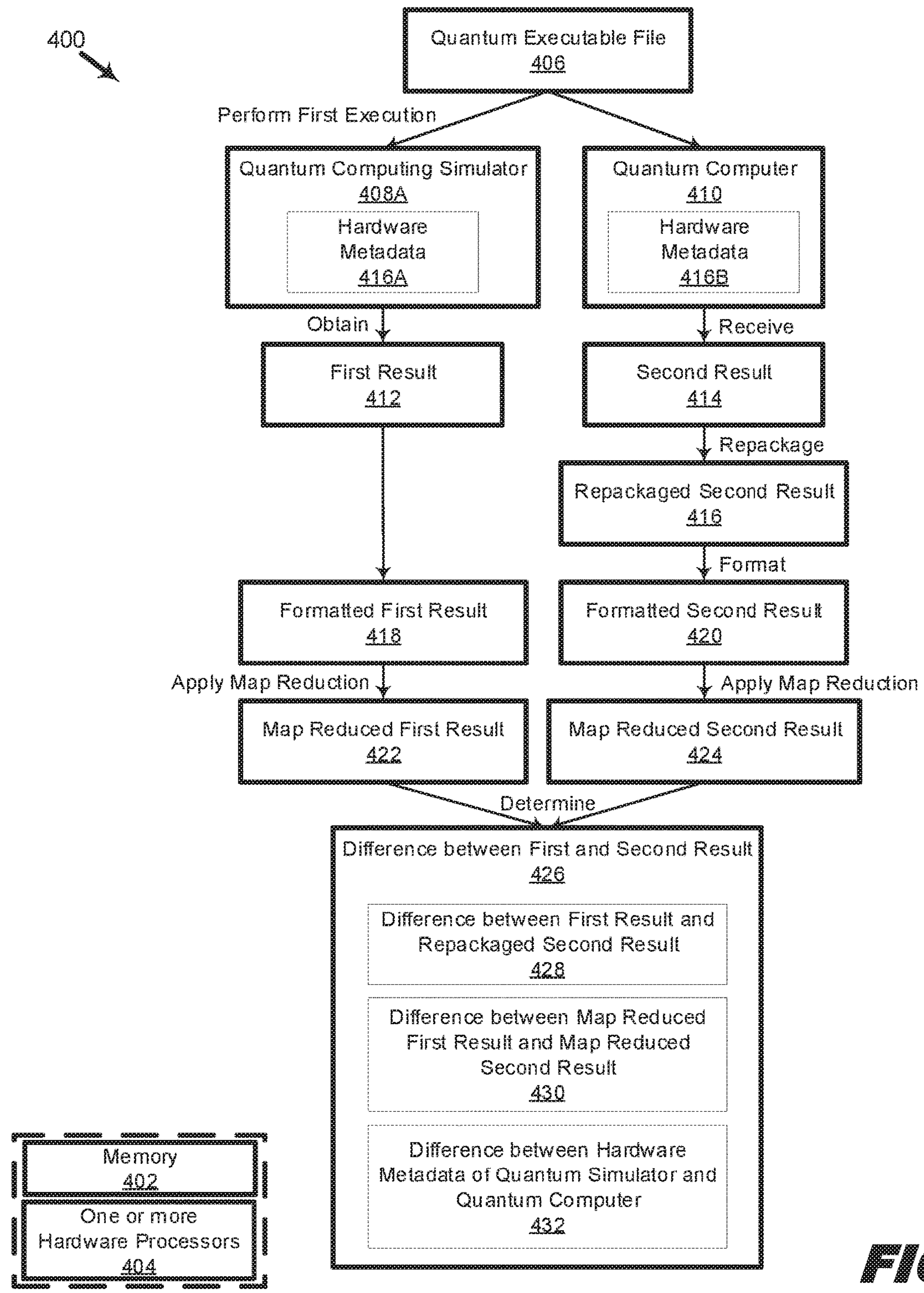
FIG. 4 is an organizational diagram illustrating a system 400 for processing and validating a quantum computing simulator result

FIG. 4 is an organizational diagram illustrating a system 400 for processing and validating a quantum computing simulator result, in accordance with various examples of the present disclosure.

The system 400 includes memory 402 and one or more hardware processors 404 similar to memory 102 and one or more hardware processors 104 described with respect to FIG. 1. The memory 402 is structured to store a first result 412 and a second result 414. The first result 412 may be obtained by executing a quantum executable file 406 by a quantum computing simulator 408A. The second result 414 may be obtained by executing a quantum executable file 406 by a quantum computer 410. The second result 414 may be received from a quantum computer 410 after the quantum computer 410 executes the quantum executable file 406. The quantum computing simulator 408A may apply hardware metadata 416A when executing the quantum executable file 406. The quantum computer 410 may apply hardware metadata 416B when executing the quantum executable file 406.

After executing the quantum executable file 406, the quantum computer 410 may generate an output file containing a result, e.g., second result 414. The output file may be in any file format. Common file formats include those suitable for storing structured data, such as a .CSV file. The quantum computer 410 output file or the second result 414 may include the hardware metadata 416B of the quantum computer 410. In some examples, the included hardware metadata 416B are one or more of the frequency, coherence time, gate error, readout error, and multiqubit error of the one or more qubits of the quantum computer 410. In some examples, the included hardware metadata 416B are the hardware metadata of the quantum computer 410 during the execution of the quantum executable file 406.

In some examples, the quantum computer 410 output file containing the second result 414 is reformatted or converted to a file format compatible with or readable by a validator service, such as the validator service described with respect to FIGS. 1, 2, and 3. In some examples, the validator service reads and processes JSON files. Thus, in such examples, the quantum computer 410 output file may be reformatted in JSON so that the validator service can read and process the quantum computer 410 output file.

In some examples, the quantum computer 410 output file is reformatted to match the file format used by the output file of the quantum computing simulator 408A. Doing so may aid the validator service in performing a more direct comparison of the first result 412 and the second result 414. In some examples, the file format of the quantum computing simulator 408A output file may be JSON. Thus, the quantum computer 410 output file, which in some examples may be a .CSV file, may be converted to JSON to match the JSON output file of the quantum computing simulator 408A. A CSV to JSON converter may be used to perform the conversion.

In some examples, the output file is first repackaged to exclude hardware metadata from the output file before reformatting. For example, the hardware metadata 416B may be removed or extracted from the quantum computer 410 output file and stored in a separate file. After the hardware metadata has been extracted, the output file may be converted using an appropriate converter to a suitable file format, e.g., JSON. Thus, after the hardware metadata 416B has been removed from the quantum computer 410 output file, the repackaged quantum computer 410 output file (now less the hardware metadata 416B) may be converted to JSON. However, in other examples, reformatting is performed before the extraction.

Repackaging may not be necessary for all output files. For example, referring to FIG. 4, notice that the quantum computing simulator 408A output file containing the first result 412 is not repackaged. This may be because the quantum computing simulator 408A may have been programmed to exclude hardware metadata 416A from the output file. Nevertheless, the hardware metadata 416A may be output by the quantum computing simulator 408A in a separate output file. Similarly, formatting may also not be necessary for all output files. For example, referring to FIG. 4, notice that the quantum computing simulator 408A output file containing the first result 412 is not reformatted. This may be because the quantum computing simulator 408A output file is already in a file format that is readable or compatible with the validator service. For example, the quantum computing simulator 408A output file may already be a JSON file. Where it may be desirable to repackage and reformat an output file of the quantum computing simulator 408A, the repackaging and reformatting techniques described above may be used.

In addition to repackaging and reformatting, the output files may also be mapped and reduced by a MapReduce function. A MapReduce function is a combination of a map function, which maps a set of data into tuples or key/value pairs, and a reduce function, which combines the mapped tuples into another data set and selects one or more of the mapped tuples belonging to the same subset of tuples as a result. For example, the output file of the quantum computing simulator 408A containing the formatted first result 418 may be mapped and reduced to generate a map reduced first result 422. Similarly, the output file of the quantum computer 410 containing the formatted second result 420 may be mapped and reduced to generate a map reduced second result 424. In some examples, the MapReduce function may be used to map the first result 412 and the second result 414 into tuples containing the observed states of the qubits and the counts of the observed state. In some examples, the MapReduce function may be used to map a repackaged first result and a repackaged second result 416 into tuples containing the observed states of the qubits and the counts of the observed state.

For example, in the nomenclature of "(observed state): count," second result 414 may be mapped to the following eight tuples (assuming a 3-qubit quantum computer 410): (000): 33; (001): 29; (010): 64; (011): 501; (100): 28; (101): 161; (110): 83; and (111): 125. Several sets of the second result 414 may be obtained, for example, by counting the observed states after some number of executions. For example, counting the observed states after 128, 256, 384, 512, 768 and 1024 executions would generate six sets of the second result 414. Thus, six of each tuple would also be generated, i.e., six (000) tuples, six (001) tuples, six (010) tuples . . . and six (111) tuples. For simplicity, consider the reduction of only the six (000) tuples. The reduce function would reduce the six (000) tuples into a single (000) tuple by selecting one of the six (000) tuples according to some selection criteria. Assume the (000) state was observed 33, 35, 38, 28, 30, and 31 times respectively after 128, 256, 384, 512, 768, and 1024 executions respectively. If the selection criterion was the highest count, then the reduce function would select the (000) tuple with the highest count out of the six (000) tuples i.e., (000): 38.

In a 32-qubit quantum computer, the number of tuples would be $2^{32}$ or 4,294,967,296 per execution. It would be enormously resource-intensive for a classical computer to determine the differences between first result 412 and the second result 414 for each of the at least $2^{32}$ tuples, and MapReduce may be used to reduce the number of tuples for comparison to a more manageable number. For example, the first result 412 and the second result 414 may be reduced to only tuples which have a significant count (e.g., 50% or more), or the top 1% of tuples with the highest counts, or the top 10 tuples, etc.

The difference 426 between the first result 412 and second result 414 may be determined at various processing stages of the output files of the quantum computing simulator 408A and the quantum computer 410. In some examples, the difference 426 is determined by the validator service. In some examples, a difference 428 may be determined after the second result is repackaged, i.e., between the first result 412 and the repackaged second result 416. In some examples, the difference may be determined after the second result is reformatted, i.e., between the first result 412 and the formatted second result 420. In some examples, a difference 430 may be determined after the first result 412 and the second result 414 are map reduced, i.e., between map reduced first result 422 and map reduced second result 424.

In some examples, the parameters of the quantum hardware are also mapped to tuples containing the parameter name and a corresponding parameter value. For example, gate error may be mapped to (gate error): 0.86. As each qubit may be associated with its own individual gate error, there may be three gate error tuples in a 3-qubit quantum computer corresponding to each of the qubits, e.g., (gate error): 0.86; (gate error): 1.46; and (gate error): 1.29. The reduce function may be used to select the gate error tuple with the highest value, i.e., (gate error): 1.46.

Determining the difference 426 between the first result 412 and the second result 414 may include determining the difference 432 between the metadata hardware 416A applied by the quantum computing simulator 408A in executing quantum executable file 406 and the hardware metadata 416B describing the actual operating conditions of the quantum computer. In some examples, the difference 432 may be determined after the metadata hardware 416A and the hardware metadata 416B are mapped. In some examples, the difference 432 may be determined after the metadata hardware 416A and the hardware metadata 416B are both mapped and reduced. In some examples, the metadata hardware 416A and 416B may also require repackaging or reformatting, which may be performed before or after mapping and reduction.

While reference has been made to repackaging, formatting, and map reducing an output file in the above discussion, such repackaging, formatting, and map reducing may also be thought of as a repackaging, formatting, and map reducing of the results, i.e., first result 412 and second result 414, since the results (or parts thereof, depending on the stage of processing) are included in each of the output, repackaged, formatted, and map reduced files.

In the foregoing description, numerous details are set forth. It will be apparent, however, to one of ordinary skill in the art having the benefit of this disclosure, that the present disclosure may be practiced without these specific details. In some instances, well-known structures and devices are shown in block diagram form, rather than in detail, in order to avoid obscuring the present disclosure. Although illustrative examples have been shown and described, a wide range of modification, change and substitution is contemplated in the foregoing disclosure and in some instances, some features of the examples may be employed without a corresponding use of other features. In some instances, actions may be performed according to alternative orderings. One of ordinary skill in the art would recognize many variations, alternatives, and modifications. Thus, the scope of the invention should be limited only by the following claims, and it is appropriate that the claims be construed broadly and in a manner consistent with the scope of the examples disclosed herein.

What is claimed is:

1. A method comprising:

performing a first execution of a quantum executable file on a quantum computing simulator to obtain a first result;

receiving a second result of the quantum executable file computed by a quantum computer;

receiving hardware metadata associated with the quantum computer, the hardware metadata defining hardware conditions during a time in which the quantum executable file was executed to create the second result;

in response to determining a difference between the first result and the second result, creating updated hardware metadata associated with the quantum computing simulator, the updated hardware metadata based on the received hardware metadata associated with the quantum computer; and performing a second execution of the quantum executable file on the quantum computing simulator to obtain a third result, wherein the second execution is based at least in part on the updated hardware metadata.

2. The method of claim 1, further comprising:

determining that the difference between the first result and the second result exceeds a predetermined value.

3. The method of claim 1, further comprising:

in response to the determining a difference between the first result and the second result, determining a difference in quantum gate manipulation between the quantum computer and the quantum computing simulator; and recommending a change to the quantum gate manipulation of the quantum computing simulator.

4. The method of claim 3, further comprising:

modifying the quantum gate manipulation of the quantum computing simulator based on the recommending, and wherein the second execution is further based at least in part on the modified quantum gate manipulation.

5. The method of claim 4, wherein the updated hardware metadata or modified quantum gate manipulation are optimized to use fewer computational resources.

6. The method of claim 1, wherein the second result is repackaged to exclude the hardware metadata associated with the quantum computer.

7. The method of claim 6, wherein the determining the difference between the first result and the second result includes determining a difference between the first result and the repackaged second result.

8. The method of claim 1, wherein the determining the difference between the first result and the second result includes determining a difference between hardware metadata associated with the quantum computing simulator and the received hardware metadata associated with the quantum computer.

9. The method of claim 1, further comprising formatting the first result and the second result as text with object notation before the determining the difference between the first result and the second result.

10. The method of claim 1, further comprising applying a map reduce function on the first result and the second result before the determining the difference between the first result and the second result.

11. The method of claim 10, wherein the determining the difference between the first result and the second result includes determining a difference between the map-reduced first result and the map-reduced second result.

12. The method of claim 1, wherein the updated hardware metadata associated with the quantum computing simulator includes data selected from the group consisting of: a frequency; a coherence time; a gate error; a readout error; and a multiqubit error.

13. A system comprising:
- a non-transitory memory storing a code coverage module;
- one or more hardware processors coupled to the non-transitory memory and that execute instructions to cause the system to perform operations comprising:
  - performing a first execution of a quantum executable file on a quantum computing simulator to obtain a first result;
  - receiving a second result of the quantum executable file computed by a quantum computer;
  - receiving hardware metadata associated with the quantum computer, the hardware metadata defining operating conditions of the quantum computer while executing the quantum executable file to generate the second result;
  - in response to determining a difference between the first result and the second result, creating updated hardware metadata associated with the quantum computing simulator based on the received hardware metadata associated with the quantum computer; and
  - performing a second execution of the quantum executable file on the quantum computing simulator based at least in part on the updated hardware metadata to obtain a third result.

14. The system of claim 13, further comprising:
- determining that the difference between the first result and the second result exceeds a predetermined value.

15. The system of claim 13, further comprising:
- in response to the determining a difference between the first result and the second result, determining a difference in quantum gate manipulation between the quantum computer and the quantum computing simulator; and
- recommending a change to the quantum gate manipulation of the quantum computing simulator.

16. The system of claim 15, further comprising:
- modifying the quantum gate manipulation of the quantum computing simulator based on the recommending, and wherein the second execution is further based at least in part on the modified quantum gate manipulation.

17. The system of claim 16, wherein the updated hardware metadata or modified quantum gate manipulation are optimized to use fewer computational resources.

18. A non-transitory machine-readable medium having stored thereon machine-readable instructions executable to cause a machine to perform operations comprising:
- performing a first execution of a quantum executable file on a quantum computing simulator to obtain a first result;
- performing a second execution of the quantum executable file on a quantum computer to obtain a second result, wherein the second result includes hardware metadata associated with the quantum computer during the second execution;
- in response to determining a difference between the first result and the second result, updating hardware metadata associated with the quantum computing simulator based on the hardware metadata associated with the quantum computer; and
- performing a third execution of the quantum executable file on the quantum computing simulator with the updated hardware metadata to obtain a third result.

19. The non-transitory machine-readable medium of claim 18, wherein the determining the difference between the first result and the second result includes determining a difference between the hardware metadata associated with the quantum computing simulator and the hardware metadata associated with the quantum computer.

20. The non-transitory machine-readable medium of claim 19, wherein the hardware metadata associated with the quantum computing simulator and the hardware metadata associated with the quantum computer is map reduced before the determining the difference between the hardware metadata associated with the quantum computing simulator and the hardware metadata associated with the quantum computer.

* * * * *